United States Patent
Melix

(10) Patent No.: US 8,234,257 B2
(45) Date of Patent: Jul. 31, 2012

(54) METHOD AND APPARATUS FOR COMPRESSING AND/OR DECOMPRESSING A DATA STRUCTURE

(75) Inventor: Pascal Melix, Boeblingen (DE)

(73) Assignee: Hewlett-Packard Development Company, L.P., Houston, TX (US)

( * ) Notice: Subject to any disclaimer, the term of this patent is extended or adjusted under 35 U.S.C. 154(b) by 1493 days.

(21) Appl. No.: 11/480,483

(22) Filed: Jul. 5, 2006

(65) Prior Publication Data

US 2007/0005628 A1    Jan. 4, 2007

(30) Foreign Application Priority Data

Jul. 4, 2005    (EP) .................................... 05106033

(51) Int. Cl.
*G06F 17/30* (2006.01)
(52) U.S. Cl. ....................................................... 707/693
(58) Field of Classification Search .................. 707/100, 707/101; 709/247; 382/232; 708/203
See application file for complete search history.

(56) References Cited

U.S. PATENT DOCUMENTS 6,405,325 B1* 6/2002 Lin et al. ......................... 714/15
7,057,757 B2* 6/2006 Yamaguchi .................. 358/1.15

OTHER PUBLICATIONS

Martin V. Lowis: "Zipfile Module: Problems with Filename Having non Ascii Characters" Internet Article, 'Online! Aug. 22, 2004 XP002351978 http://mail.python.org/pipermail/python-list/2004-Aug./235681.html.
Anonymous: "Quoted-Printable Content-Transfer-Encoding" Internet Article, 'Online! May 26, 2001, XP 002351976 http://www.freesoft.org/CIE/RFC/1521/6.html.
Appnote.txt-.zip file format specification Jan. 11, 2001 XP002296121 p. 1-22.
Anonymous: "Quoted-printable" Internet Article, 'Online! Dec. 15, 2004 XP002351977 http://de.wikipedia.org/w/index.php?title=Quoted-printable&oldid=6852071.
Borenstein N et al: "RFC 1521; MIME (Multipurpose Internet Mail Extensions) Part One: Mechanisms for Sepcifying and Describing the Format of Internet Message Bodies" Network Working Group Request for Comments, Sep. 1993 pp. 1-44.
Anonymous Zipping up Unicode file names Internet Article 'Online! May 12, 2005 XP002351982 http://blogs.msdn.com/michkap/archive/2005/05/10/416181.aspx.

* cited by examiner

*Primary Examiner* — Cam-Linh Nguyen

(57) ABSTRACT

A method of compressing a data structure having data content and at least one content name associated with the data content, using a compression scheme capable of compressing content names only if including characters from a restricted character set, includes encoding a content name including a character not from the restricted character set into a representation using characters from the restricted character set, and compressing the data structure.

17 Claims, 4 Drawing Sheets

METHOD AND APPARATUS FOR COMPRESSING AND/OR DECOMPRESSING A DATA STRUCTURE

RELATED APPLICATION

The present application is based on, and claims priority from, EP Application No. 05106033.3, filed Jul. 4, 2005, the disclosure of which is hereby incorporated by reference herein in its entirety.

TECHNICAL FIELD

The invention relates to a method and apparatus for compressing and/or decompressing a data structure.

BACKGROUND

Lossless data compression schemes such as zip for compressing data structures are well known. However, the zip format in its current standard implementation has developed such that it supports only file or directory names containing characters from a restricted set of characters, namely ISO-Latin-1 (ISO 8859-1) characters. Such a restricted character set includes, for example, letters of the Roman alphabet (upper and lower case) additional common accented characters (á, ö etc.) numerical values, punctuation symbols and so forth and is effectively an extension of the ASCII character set. As a result problems can be encountered when attempting to zip data structures including file or directory names comprising characters not from the restricted character set. According to one existing solution, a version of zip has been created allowing the use of Japanese characters in file or directory names, but this extension is limited only to the alternative character set and in fact is not compatible even with the ISO-Latin-1 version.

SUMMARY

In brief, this invention provides a method of compressing a data structure having data content and at least one content name associated with the data structure, using a compression scheme capable of compressing content names only if comprising characters from a restricted character set. The method comprises encoding a content name including a character not from the restricted character set into a representation using characters from the restricted character set, and compressing the data structure. Associated decompression methods and apparatus are also provided. Because content names with characters not from the restricted character set are encoded into a representation using characters from the restricted character set, the data structure can be subsequently compressed.

BRIEF DESCRIPTION OF THE DRAWINGS

Embodiments of the invention will now be described, by way of example only, with reference to the drawings, of which.

DETAILED DESCRIPTION OF EMBODIMENTS

There will now be described by way of example the best mode contemplated by the inventors for carrying out the invention. In the following description numerous specific details are set forth in order to provide a thorough understanding of the present invention. It will be apparent however, to one skilled in the art, that the present invention may be practiced without limitation to these specific details. In other instances, well known methods and structures have not been described in detail so as not to unnecessarily obscure the present invention.

Figure 1:
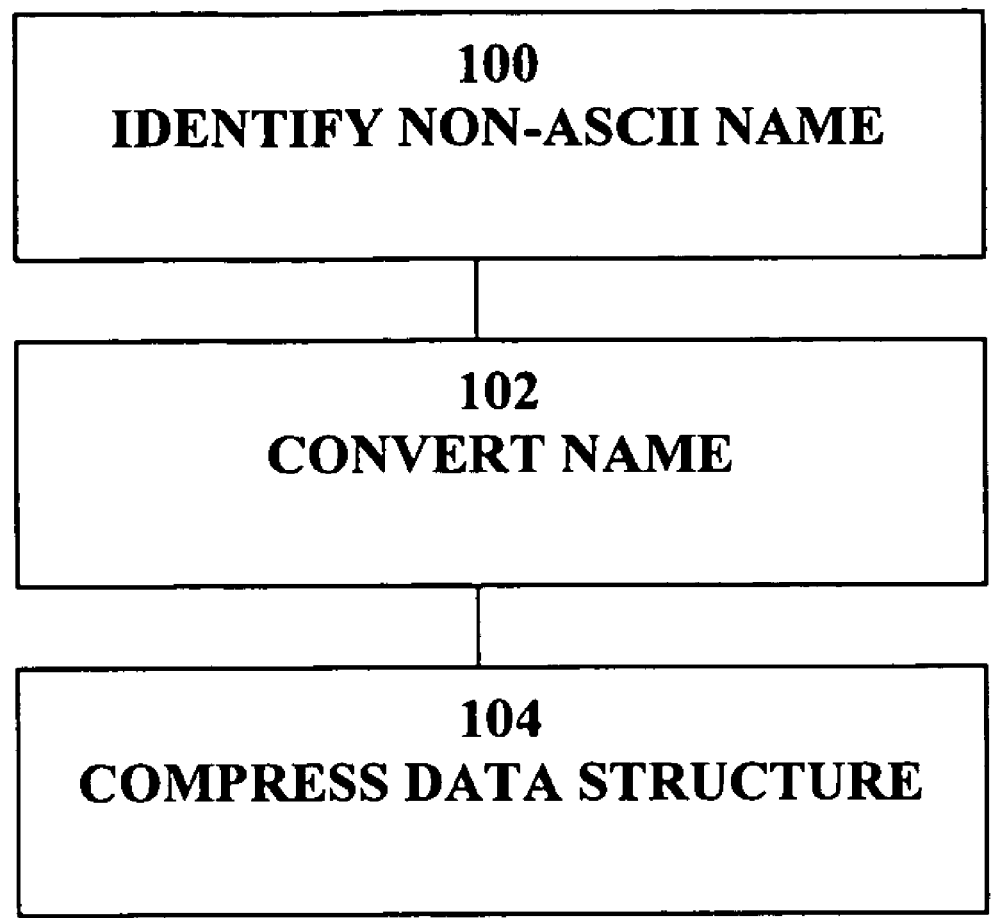
FIG. 1 is a flow diagram showing the steps performed according to the method described herein.

In overview, operation of the method described herein can be understood with reference to FIG. 1. Where it is desired to compress a data structure such as a system of directories containing files using a compression scheme such as zip compression, at step 100 any content names, for example the directory name or names of files within the directory, which do not belong to a character set supported by the compression scheme, are identified. For example non-ASCII or non-ISO-Latin-1 directory name or file names maybe so identified. At step 102 the identified name is converted to a representation using characters from the restricted character set by encoding at least each of the non-supported characters using a coding employing restricted character set characters in a decodeable manner if using a consistent and repeatable coding scheme as described in more detail below. Then, at step 104 the complete data structure including the content names and the data content itself is compressed.

As a result the compression scheme itself compresses only supported characters, including the encoded portions in the directory and file names. When the compressed file is decompressed, the encoded representations can be subsequently decoded to provide the originally non-supported character set directory or file names. The encoded representations can include identifiers ensuring that they, or the encoded portion, are recognised as encoded, and decoded appropriately. In addition, where the compressed data structure comprises a directory structure including a plurality of files, an additional flag file, for example an empty file having a predetermined, identifiable file name, can be added into the directory prior to compression. Then, upon decompression, directories including content names that have been encoded can be immediately recognised and decompressed and decoded appropriately.

As a result conversion of directory and file names is allowed in a bidirectional, reversible manner enabling zip files to include file and directory names including characters not supported per se, for example the method can be applied to allow conversion of content names including any Unicode characters, a super-set of ISO-Latin-1 where these are encoded into a representation using only supported characters which can be ISO-Latin-1 or, for example, a sub-set thereof such as a ASCII.

The method described herein can be understood in more detail with reference to the architecture of FIG. 2 in conjunction with the zip and unzip operations described with reference to FIGS. 3 and 4.

Figure 2:
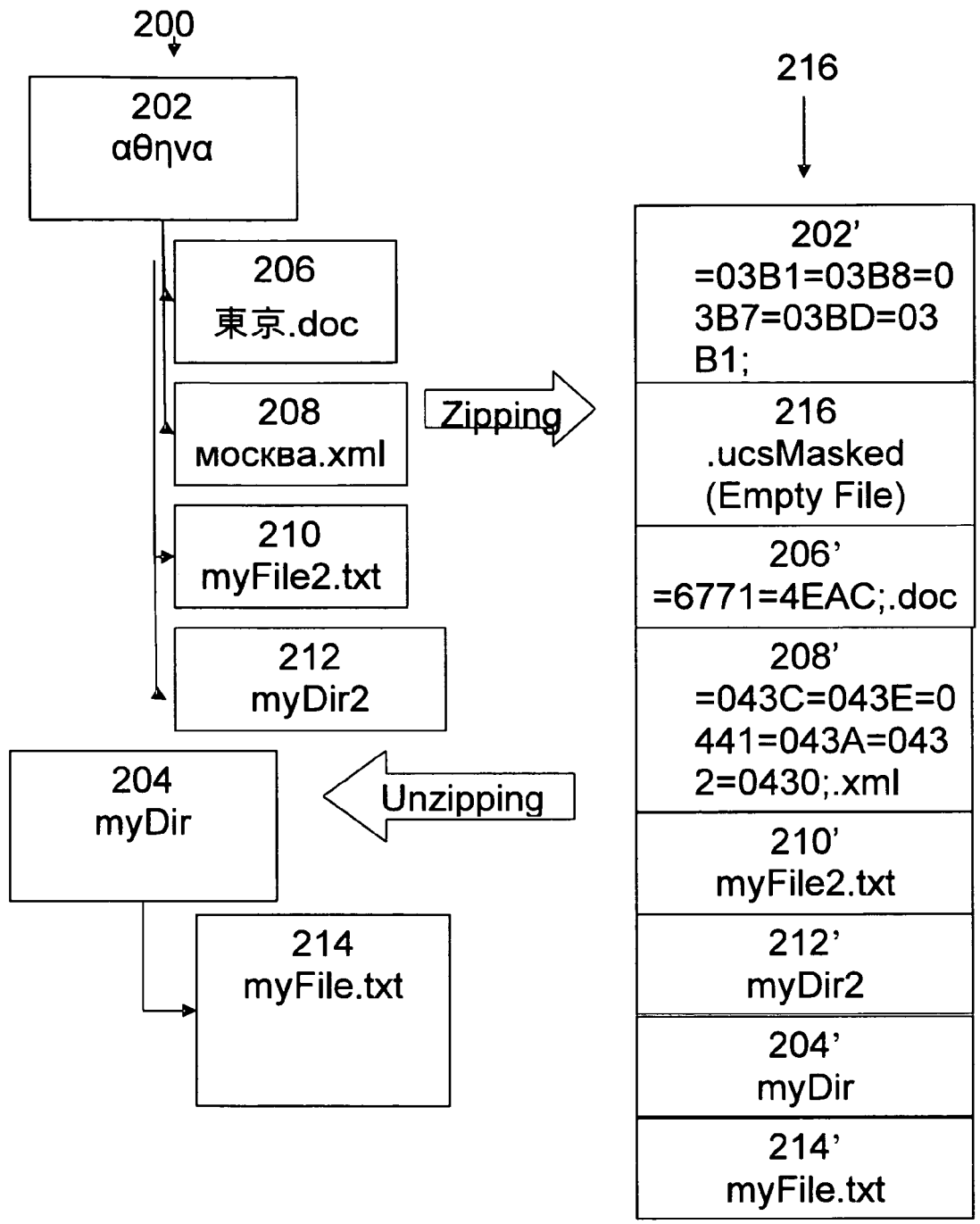
FIG. 2 is a block diagram showing the architecture of a data structure in zipped and unzipped form.

Referring firstly to FIG. 2 a data structure comprising a file system 200 comprises first and second directories 202, 204. Directory 202 has, as a contents name, directory name αθηνα, i.e., in non-supported characters as these Unicode characters do not form part of ISO-Latin-1. Directory 202 further includes files 206, 208, 210, each including, as content name, a file name and further including data content. File 206 includes a non-ISO-Latin-1 file name 東京.doc, file 208 includes a non-Latin-ISO-1 file name MOCKBa.xml. However file 210 includes file name myFile2.txt, which is supported by the restricted character set. Directory 202 yet further includes a first sub-directory 212 having directory name myDir2, which name is also supported by the character set. Sub-directory 212 contains additional files (not shown) having file names supported by ISO-Latin-1.

Second directory 204 has directory name myDir, which is supported and contains a single file myFile.txt which again is a supported file name.

Figure 3:
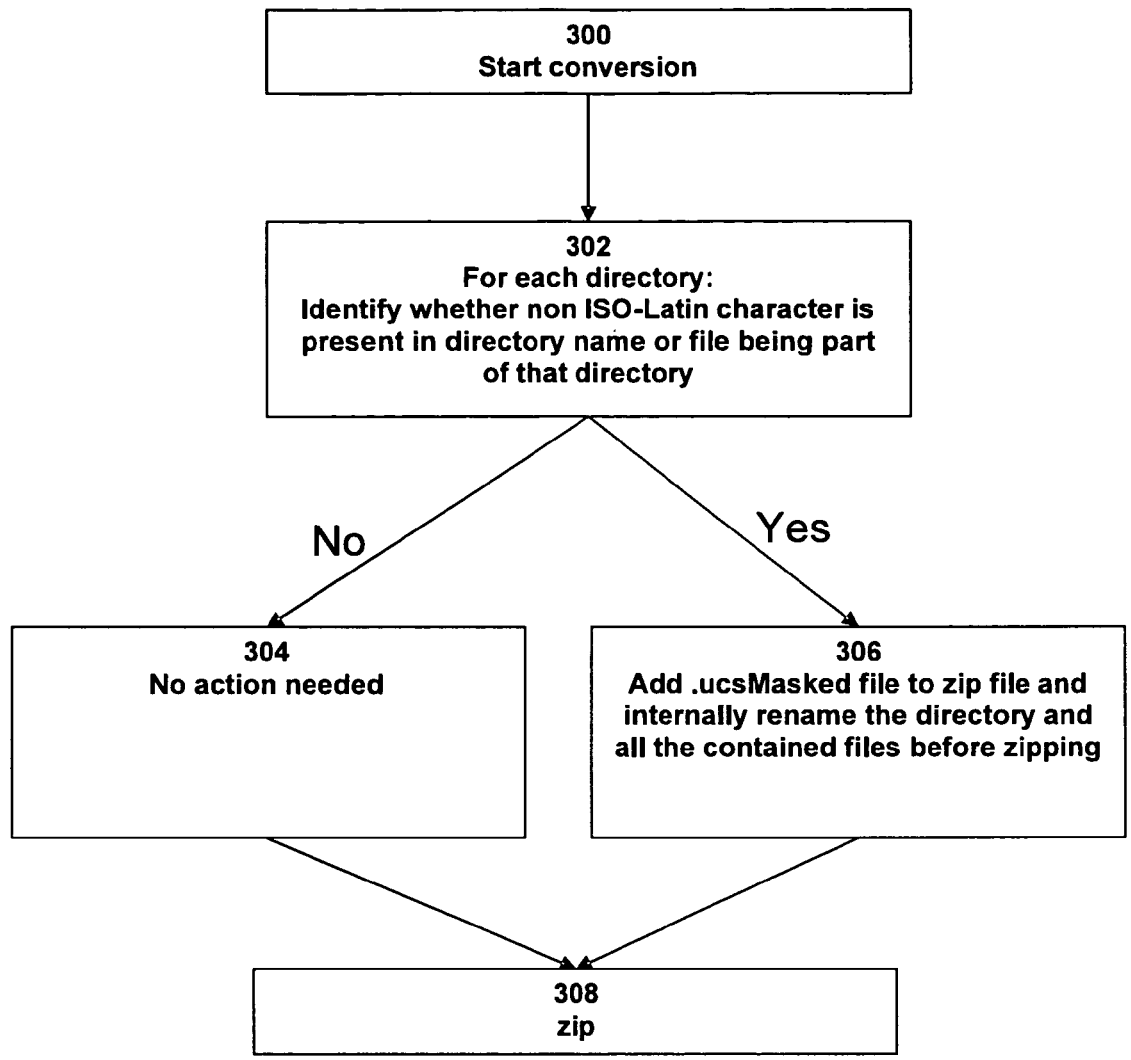
FIG. 3 is a flow diagram illustrating in more detail the steps involved in a zipping operation.

Turning now to FIG. 3 the zipping process can be understood in more detail. At step 300 the conversion and zipping process begins. At step 302, for each directory within the data structure 200, it is identified whether any non-supported, i.e., non ISO-Latin character is present in any associated content name, that is, the directory name or the file name of any file which is part of that directory. Identification can be carried out in any appropriate manner. For example the characters in the content name can be compared to a database, or table, containing the restricted character set to identify whether there is a match. As described in more detail below, however, this does not include the directory name of any sub directories or files within that sub-directory.

If not then, in step 304, no conversion step is required. Otherwise, however, at step 306, as a preprocessing step, the directory and all of the contained files are converted prior to zipping by renaming them. In particular, the directory and file names are encoded into a representation using supported characters from the restructured character set, eg ISO-Latin-1 or a subset thereof, eg ASCII.

This can be achieved using any algorithm that uniquely and reversibly converts Unicode characters (that is characters from the Unicode super set of characters that include ISO-Latin-1) to a string containing only supported characters (i.e., from ISO-Latin-1) or a subset thereof (for example ASCII characters whose code is below 128) and which does not contain any illegal file or directory name characters for example illegal characters as specified by the operating system supporting the directory structure.

One specific approach is to apply an extension of the QuotedPrintable conversion format which is well known to the skilled reader and is not described in detail herein. The QuotedPrintable conversion approach is applied to text strings, for example, to ensure that data transported by mail, for example, is unlikely to be modified.

In particular each character outside of the supported restricted character set, for example each character outside of ISO-Latin-1, is encoded by conversion to a four digit hexadecimal representation of its Unicode value preceded by an=character as encoding identifier to form a masked character. Where a subsequent character is not masked, i.e., it does not need encoding because it is supported by the restricted character set, the masked character is followed by a; character as encoding identifier as a lead out character to mark the end of the masked part. However, no lead out character is required between two masked characters. As a result it will be seen that it is further necessary to convert the characters=and; if appearing in the original content name to an encoded representation as well. It will be noted that, unlike QuotedPrintable, a four digit hexadecimal representation of the non-supported portions of the content name is required to support the full range of extended character set characters in Unicode.

In addition, an empty file with a predetermined name is added to the directory to act as a "flag file", that is, to indicate that conversion of content name has taken place within the directory. In the embodiment described herein, the file name ucsMasked is adopted although it will be appreciated that any pre-determined file name can be used. Of course if the directory already includes a file with this name then appropriate steps can be taken. For example the existing file can be renamed and the flag file can be inserted including, as data content, instructions to change the file name of the existing file back upon the compression and conversion to the original data structure.

Following the conversion steps, at step 308 the converted structure is zipped. The zipped structure can be further understood with reference, once again, where the zipped structure is designated 216. In particular, it will be seen that directory 202, zipped as 202' has been renamed =03B1= 03B8 =03B7=03BD=03B1;. File 206 has be renamed as file 206' with name =6771=4EAC;.doc. It will be seen that the supported characters (.doc) have been retained whereas the preceding non-supported characters are represented as for digit hexadecimal encodings with lead-out character;. File 208 has been zipped as file 208' with encoded name representation =043C=043E=0441=043A=0432=0430;.xml. File 210 has been zipped as file 210' but, as the name is entirely formed of ISO-Latin-1 characters, no name conversion has taken place and the file name remains myFile2.txt.

The sub-directory 212 has been zipped as 212' and the name remains unchanged as myDir2 as it consists only of supported characters. As discussed above, the content names associated with the sub-directory, that is its own directory name and the names of any files contained therein, will not automatically have been converted according to the present embodiment during conversion of the parent directory. However the sub-directory will similarly be scanned to see whether any of the content names contain unsupported characters in which case the conversion steps discovered above will take place in relation to the sub-directory as well. In addition, during the conversion process, an additional empty file 216 entitled ucsMasked is inserted into the zipped directory 202' indicating that conversion has been carried out in relation to the content names associated with the directory.

It will further be seen that this approach can be applied to alternative cases, for example where the directory name itself contains supported characters but contained file names contain unsupported characters and vice versa.

Similarly directory 204 is zipped as directory 204' with unchanged name myDir, and containing zipped file 214 dashed with unchanged name myFile.txt, and conversion will not have been carried out in relation to directory 204 as it will have been identified as having only supported content names.

It will be seen, therefore, that the conversion steps provide an immediately recognisable encoded format for non-supported characters whilst allowing zipping of those characters using standard zip schemes, as the encoded representations only comprise supported characters. It will further be seen that the conversion steps and associated computational requirements need only be performed on directories containing associated content names, that are unsupported, the processing required being reduced even further in the event that sub-directories are scanned and converted separately.

Figure 4:
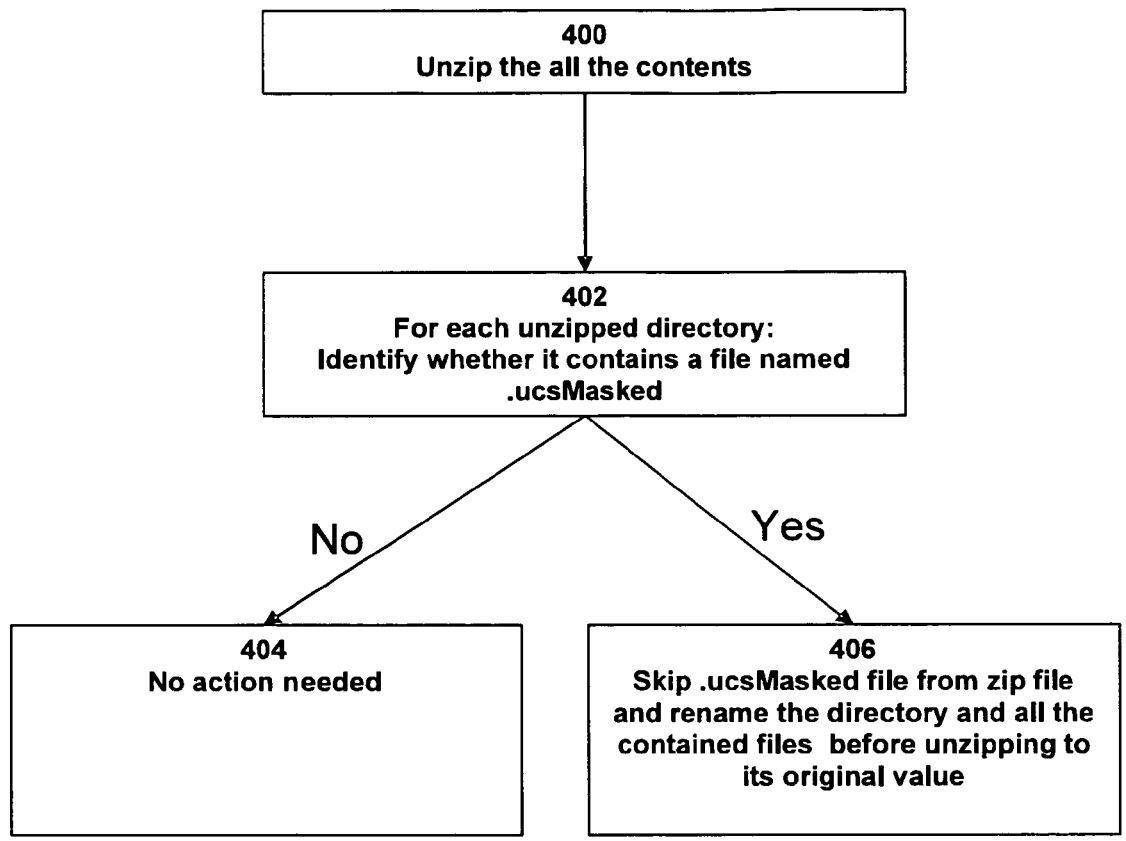
FIG. 4 is a flow diagram illustrating in more detail the steps involved in an unzipping operation.

Turning now to FIG. 4, the steps involved in the unzipping operation can be understood in more detail. At step 400 the contents of the zipped file are unzipped. This will provide an unzipped data structure including directory or file names in encoded representation. As a result it is possible to unzip the encoded and compressed data without modification to existing unzip functionality. However additional post-processing steps may then be carried out to then decode the data content names. Accordingly, at step 402, for each unzipped directory it is identified whether a flag file named ucsMasked is contained in that directory. If not then clearly no conversion has taken place such that the content names do not need to be decoded—for example as shown in directory 204 and file 214 contained therein in FIG. 2. However if the directory does contain the flag file then this file is deleted from the unzipped data structure and the remaining directory and contained files, for example directory 202 and contained files 206, 208, 210, are renamed to their original names by reversing the encoding scheme described above allowing the case of existing zip libraries and adding additional implementation steps outside of them.

It will be seen that the step of deleting the flagged file ensures that it is not included in the final unzipped structure. Of course any appropriate steps can be taken alternatively to remove the flagged file from the final unzipped structure.

As discussed above, any appropriate conversion algorithm to provide an encoded representation of the non-supported file name can be implemented. In an optimisation, such an algorithm would leave ASCII characters mostly unchanged to enable recognition by humans in many cases. In addition the algorithm should avoid conversion into characters that may be recognised and misinterpreted by some applications. As a result other possible schemes, but with potential incompatibility issues, include base64, UUencoding and URLencoding.

Figure 5:
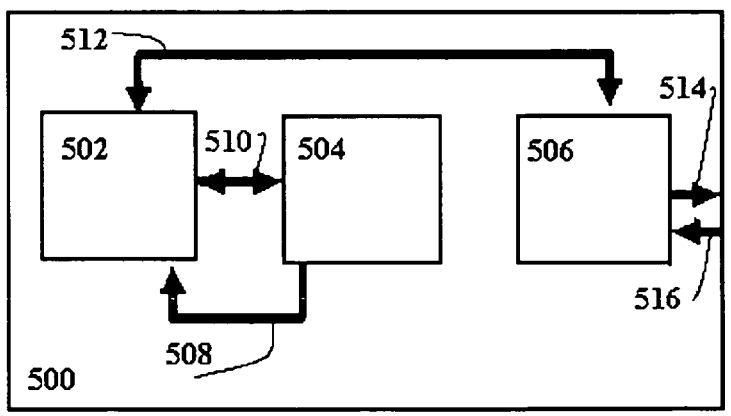
FIG. 5 is a block diagram illustrating a computer apparatus for implementing the method described herein.

It will be recognised that the method described herein can be implemented on any appropriate computer apparatus such as a personal computer (PC). For example a hardware structure shown as FIG. 5 can be used to implement the invention. The apparatus comprises a computer generally designating 500 including a processor 502, a memory 504 and an interface, for example to a network, 506. The processor, memory and interface interact in a standard manner for example as found on a PC.

The processor acts as a data structure compression/decompression module and, for example, obtains a data structure to be compressed from memory 504 as indicated by arrow 508. The processor 502 carries out the conversion and zipping process described above and then forwards the compressed file to memory 504 as designated by arrow 510 or to the external interface 506 as designated by arrow 512 as appropriate. The external interface, for example, can then forward the compressed structure to a remote location as an e-mail attachment, using ftp or in any other appropriate manner as designated by arrow 514.

Conversely, the processor can act to decompress a zipped file and convert any coded content names to their original representation. The compressed file may be received from the interface 506 having been sent from a remote location as designated by arrow 516 and forwarded to the processor 502 as designated by arrow 512. Alternatively the compressed file may be retrieved from memory 504 as designated by arrow 510. The skilled person will recognise that appropriate modification to the specific software code from the compression scheme can be implemented without the requirement for detailed explanation here. For example in the case of the zip compression scheme, appropriate steps for content name recognition, conversion, flag file recognition and de-conversion can be implemented in any appropriate manner.

As a result of the method described herein, a bidirectional reversible conversion is provided between directory name/file name which is user visible and compatible with a data compression scheme such as zip and which is not incompatible with additional applications as appropriate.

It will be appreciated that the method described herein can be implemented in relation to any compression scheme where directory/file names are only supported in the restricted character set and in relation to any appropriate data structure and content name type. Any appropriate encoding/decoding scheme can be adopted, and characters from any desired super set, including but not limited to Unicode can be encoded into any desired sub set including but not limited to ASCII as appropriate. In addition the method can extend to a method of decompressing a decompressed data structure having data content and at least one content name associated with the data structure comprising carrying out a primary decompression step, identifying encoded content names and decoding said identified content names, preferably in which the encoded names are identified by recognition of an identifier in the encoded representation, or preferably in which a data structure including encoded content names is recognised from a flag file within the data structure, and an apparatus for compressing/decompressing data structure comprising a processor configured to operation under instructions contained in the computer-readable medium to implement the method described herein.

The invention claimed is:

1. A computer-implemented method of compressing a data structure containing data content and further containing at least one content name, using a compression scheme capable of compressing content names only if the content names include characters from a restricted character set, the method comprising:

encoding, by a hardware processor, a content name including a character outside the restricted character set into a representation using characters from the restricted character set, adding a flag file to a directory of the data structure to flag the data structure as including encoded content names, and compressing the data structure.

2. A method as claimed in claim 1, further comprising:

identifying a data structure including a content name, wherein said identified content name includes a character outside the restricted character set, and encoding said identified content name.

3. A method as claimed in claim 1, further comprising:

including an encoding identifier in the representation.

4. A method as claimed in claim 3, wherein the encoding identifier is included in association with encoded portions of the encoded representation.

5. A method as claimed in claim 1, wherein the data structure comprises a data file and a file name.

6. A method as claimed in claim 1, wherein the data-structure-includes a directory has as a content name a directory name and contains one or more data files each having, as content name, a file name and further including data content.

7. A method as claimed in claim 6, further comprising:

identifying a data structure including a content name including a character outside the restricted character set.

8. A method as claimed in claim 7, further comprising:

encoding each content name associated with the identified data structure.

9. A method as claimed in claim 1, further comprising:

decompressing a compressed data structure, identifying any directory including a flag file and decoding content names associated with the directory.

10. A method as claimed in claim 1, wherein the data compression scheme comprises zip encoding.

11. A method as claimed in claim 1, wherein the restricted character set comprises ASCII.

12. A method as claimed in claim 1, wherein the encoding scheme comprises representing, using restricted character set characters and an encoding identifier, a numerical value attached to each character outside the restricted character set.

13. A computer-implemented method of decompressing a data structure having data content and at least one content name associated with the data content and compressed by a method as claimed in claim 1, the method comprising:
decompressing, by a hardware processor, a compressed data structure and decoding encoded content names.

14. A method as claimed in claim 13, wherein a flag file is included in a directory including encoded content names, the method further comprising:
identifying a directory including a flag file, and
decoding only content names associated with the identified directory.

15. An apparatus for compressing a data structure containing data content and further containing at least one content name, using a compression scheme capable of compressing the content names only if the content names include characters from a restricted character set, the apparatus comprising:
a data structure compression module executed by a hardware processor and arranged to encode character names including characters outside the restricted character set into a representation using the restricted character set, add a flag file to a directory of the data structure to flag the data structure as including encoding content names, and compress the data structure.

16. An apparatus for decompressing a data structure having data content and at least one content name associated with the data content, and compressed according to a method as claimed in claim 1, the apparatus comprising:
a data structure decompression module executed by a hardware processor and arranged to decompress the data structure and decode encoded content names.

17. A non-transitory computer readable medium containing instructions which, when executed by a processor, cause the processor to implement the method of claim 1.

* * * * *

UNITED STATES PATENT AND TRADEMARK OFFICE
CERTIFICATE OF CORRECTION

| | | |
|---|---|---|
| PATENT NO. | : 8,234,257 B2 | Page 1 of 1 |
| APPLICATION NO. | : 11/480483 | |
| DATED | : July 31, 2012 | |
| INVENTOR(S) | : Pascal Melix | |

It is certified that error appears in the above-identified patent and that said Letters Patent is hereby corrected as shown below:

In the Claims:

In column 6, lines 50-51, in Claim 6, after "the" delete "data-structure-includes a".

In column 6, line 51, in Claim 6, after "has" delete "as".

In column 8, line 6, in Claim 15, delete "encoding" and insert -- encoded --, therefor.

Signed and Sealed this
Eighth Day of January, 2013

David J. Kappos
*Director of the United States Patent and Trademark Office*